United States Patent [19]

Crowder et al.

[11] 4,274,105
[45] Jun. 16, 1981

[54] MOSFET SUBSTRATE SENSITIVITY CONTROL

[75] Inventors: Billy L. Crowder, Putnam Valley; Fritz H. Gaensslen, Yorktown Heights, both of N.Y.; Richard C. Jaeger, Boca Raton, Fla.

[73] Assignee: International Business Machines Corporation, Armonk, N.Y.

[21] Appl. No.: 974,594

[22] Filed: Dec. 29, 1978

[51] Int. Cl.³ .................... H01L 29/78; H01L 29/167
[52] U.S. Cl. ......................................... 357/23; 357/64
[58] Field of Search ........................ 357/23, 64, 89, 90

[56] References Cited

U.S. PATENT DOCUMENTS

| | | | |
|---|---|---|---|
| 3,248,677 | 4/1966 | Hunter et al. | 357/64 |
| 3,449,644 | 6/1969 | Nassibian | 357/23 |
| 3,585,463 | 6/1971 | Richman | 357/23 |
| 3,600,647 | 8/1971 | Gray | 357/23 |
| 3,631,310 | 12/1971 | Das | 357/23 |
| 3,653,978 | 4/1972 | Robinson et al. | 357/23 |
| 3,654,531 | 4/1972 | Krambeck et al. | 357/64 |
| 3,745,425 | 7/1973 | Beale et al. | 357/23 |
| 3,810,128 | 5/1974 | Moser | 357/64 |
| 3,912,545 | 10/1975 | Armstrong | 357/23 |
| 4,021,835 | 5/1977 | Etoh et al. | 357/23 |
| 4,053,925 | 10/1977 | Burr et al. | 357/64 |
| 4,091,405 | 5/1978 | Ishida | 357/23 |
| 4,132,998 | 1/1979 | Dingwall | 357/23 |

OTHER PUBLICATIONS

Brotherton et al., Proc. Conf. on Integrated Circuits, East England, May 1967 (IEEE Conf. Pub. #30).
Proc. IEEE, Richman, pp. 774–775, (Apr. 1968).

Primary Examiner—William D. Larkins
Attorney, Agent, or Firm—Alvin J. Riddles

[57] ABSTRACT

The sensitivity of the threshold voltage in MOSFET devices to changes in substrate voltage may be reduced at a given temperature by the introduction of sufficiently deep energy level, low diffusivity impurities into the depletion region under the gate of the MOSFET.

3 Claims, 4 Drawing Figures

MOSFET SUBSTRATE SENSITIVITY CONTROL

DESCRIPTION

TECHNICAL FIELD

The technical field of the invention involves metal oxide semiconductor field effect transistor (MOSFET) devices. In these devices a charge on the gate electrode with essentially metallic conduction operates to invert the conductivity type of a semiconductor region beneath the gate and thereby change the conductivity between a source and a drain electrode. Such devices, however, in operation indicate a sensitivity to the magnitude of the source to substrate voltage and the result is that the threshold voltage is increased. The increased threshold voltage, in turn, causes the current level of the device to decrease for a given gate to source voltage drive. Therefore, the performance of circuits using these devices is degraded by this effect. This invention counteracts the increase in threshold voltage and thereby reduces the performance degradation.

BACKGROUND ART

The problem of substrate sensitivity has been known in the art and efforts at its control by the introduction of impurities in the semiconductor have been undertaken for some time in various structures.

U.S. Pat. Nos. 3,449,644; 3,585,463 and 3,829,885 all involve the introduction of gold as an impurity in different types of semiconductor structures in order to improve the design, operation and performance of the devices. A problem, however, is present in that an impurity such as gold tends to diffuse rapidly and hence to migrate during hot processing steps and in use under all but fairly low operating temperatures.

DISCLOSURE OF THE INVENTION

For purposes of explanation, details of the invention will be described in connection with n-conductivity type although it will be apparent to one skilled in the art in the light of the principles to be evolved that conversion to p-conductivity type may be readily accomplished.

The reduction of the substrate sensitivity in n-channel MOSFET devices is accomplished by introducing into the depletion region under the gate, a concentration of a sufficiently deep level donor impurity with low diffusivity.

At room temperature a donor impurity with an energy level of about 0.2 to 0.3 eV below the conduction band edge would be appropriate whereas at liquid nitrogen temperature (77 K.) an energy depth of 0.04 to 0.05 eV is sufficient. During operation of the device, the ionized donor impurities partially compensate the normally present acceptor charge. This compensation effect then results in a significant reduction in substrate sensitivity of the device.

BEST MODE OF CARRYING OUT THE INVENTION

Figure 1:
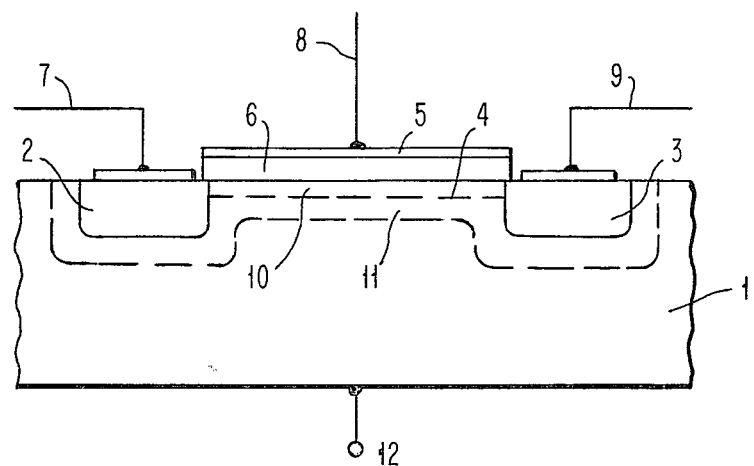
FIG. 1 is a cross sectional illustration of a MOSFET device including the region in which the substrate sensitivity control of the invention is employed.

Referring to FIG. 1 a cross sectional view is provided of a metal oxide semiconductor field effect transistor (MOSFET) wherein a p-type substrate 1 is provided with an n-type source diffusion 2 and an n-type drain diffusion 3 separated by a channel region 4 over which a metal gate 5 is placed separated by an oxide 6 from the surface of the substrate region 1. External electrodes 7, 8, 9 and 12 respectively, are provided to the source 2, the gate 5, the drain 3 and the substrate 1 regions of the device.

Figure 2:
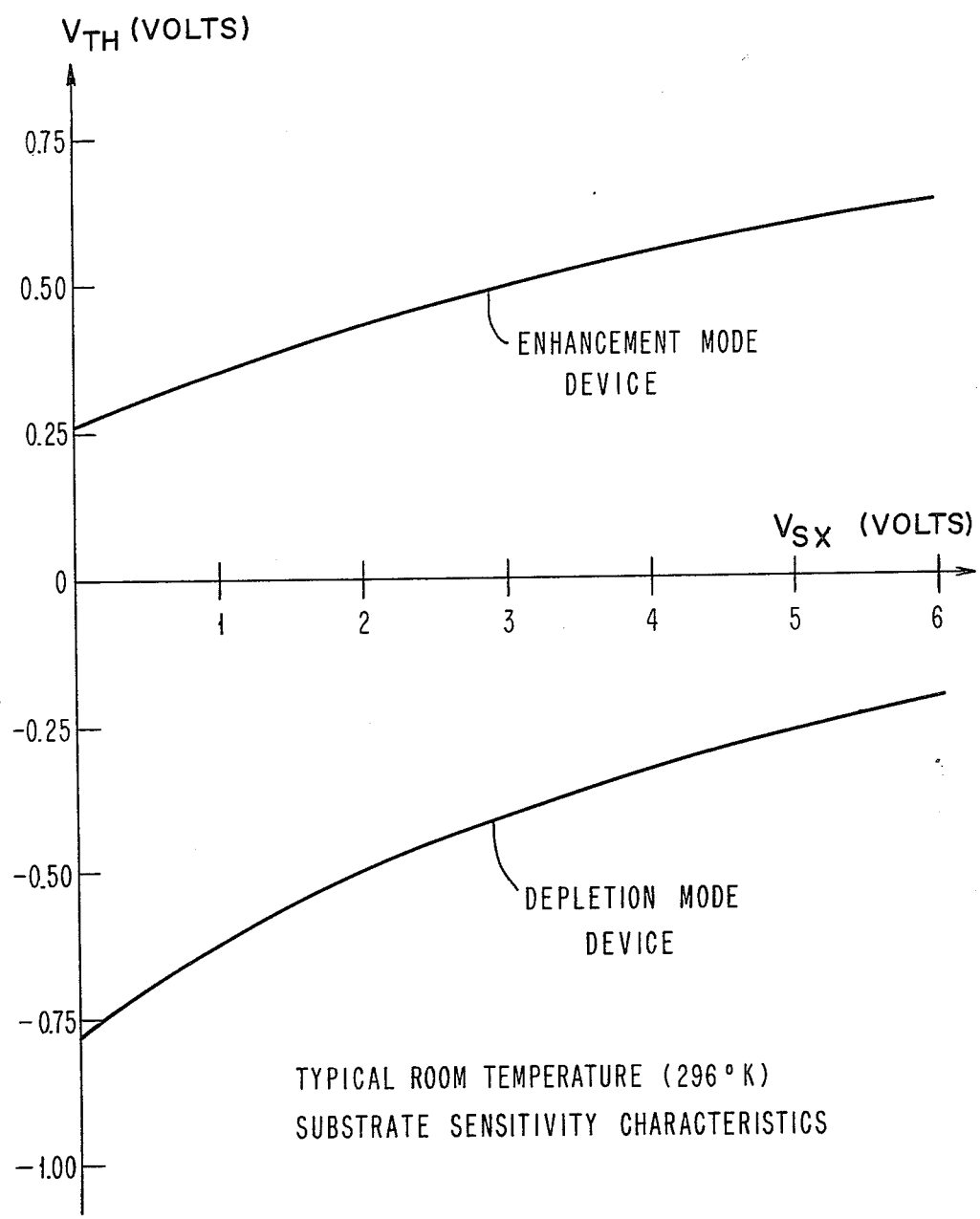
FIG. 2 is a graph indicating room temperature substrate sensitivities of typical enhancement mode and depletion mode devices.

In operation a sufficiently large signal applied between gate 5 and source 2 creates a conducting channel of electrons 10 between source and drain. The gate voltage required to establish this channel is called threshold voltage and is a function of the substrate potential as shown in FIG. 2. The channel 10 is separated from the substrate bulk by a depletion region 11.

In source follower type operation the device of FIG. 1 suffers from an increase in threshold voltage so that larger and larger signals at gate 8 are required to maintain conduction. Because of this change in threshold voltage the circuit performance deteriorates.

In accordance with the invention, deep level donor impurities are introduced into the depletion region 11 in a concentration such that in operation some of the impurities will be ionized and will thereby produce an additional positive charge that will compensate for the usual increase in negative acceptor charge which accompanies the increase in source-to-substrate voltage. In a normal device this increase in acceptor charge is responsible for the increase in threshold voltage.

It is important that the deep energy level donor impurities have a relationship to the conduction band such that partial ionization can readily take place. The appropriate energy level of impurity at room temperature is considered to be from 0.2 to 0.3 electron volts below the conduction band edge. It is also of importance that the impurities introduced have a low diffusivity both for the purposes of causing it to stay put during subsequent hot processing steps in the fabrication of the devices or arrays thereof and also with respect to the environmental conditions to which the device may be exposed in operation.

Referring next to FIG. 2, a graph is provided which illustrates the variation of threshold voltage $V_{TH}$ as function of substrate voltage $V_{SX}$ for the two main types of MOSFET devices, the enhancement mode device and the depletion mode device. In the case of the depletion mode device it should be noted that there is a variation of over ½ of a volt in threshold voltage over a 6 volt substrate voltage range. In the case of the enhancement mode device, the variation is in the vicinity of 0.375 volts. This variation must be taken into consideration in designing circuits using these devices and places a limit on performances.

Figure 3:
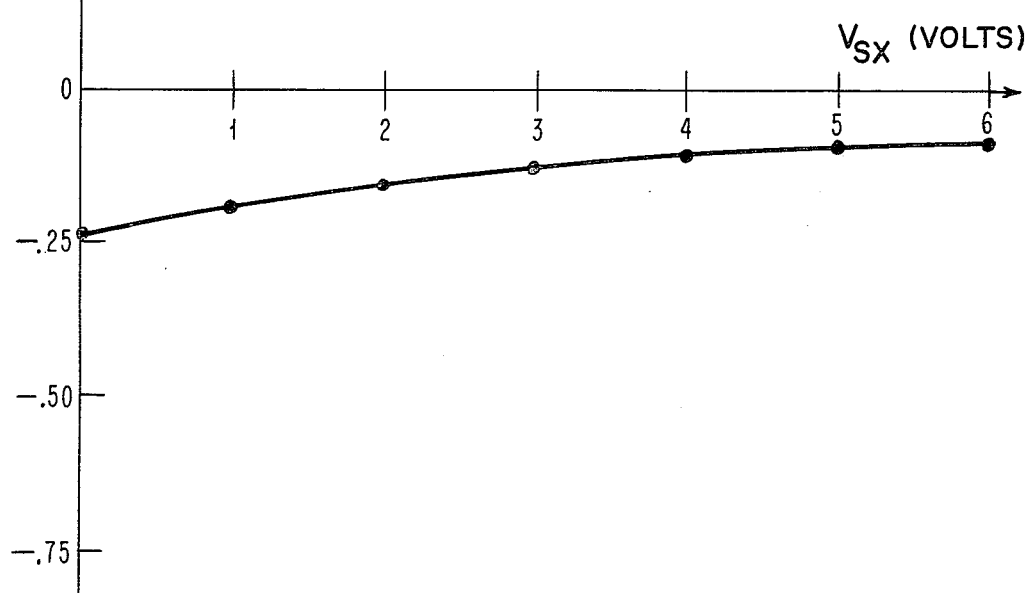
FIG. 3 is an illustration of the effect on substrate sensitivity of the presence of implanted donor impurities at liquid nitrogen temperatures.

FIG. 3 illustrates the liquid nitrogen behavior of a comparable depletion mode device as in FIG. 2. At this temperature a large percentage of donors is frozen out as evidenced by the increase in threshold voltage. When changing from no substrate voltage towards higher values, the substrate sensitivity is substantially decreased below its room temperature value. This effect is caused by a field enhanced ionization of the frozen out donors. Thus additional positive charge becomes available thereby partially compensating for the negative charge that is normally uncovered in the device bulk at these voltages.

In accordance with the invention it is important that the donor impurities have a low diffusivity and have energy levels below the conduction band edge by an amount commensurate with the temperature of operation. In the case of room temperature operation, a possible donor impurity is tellurium.

Figure 4:
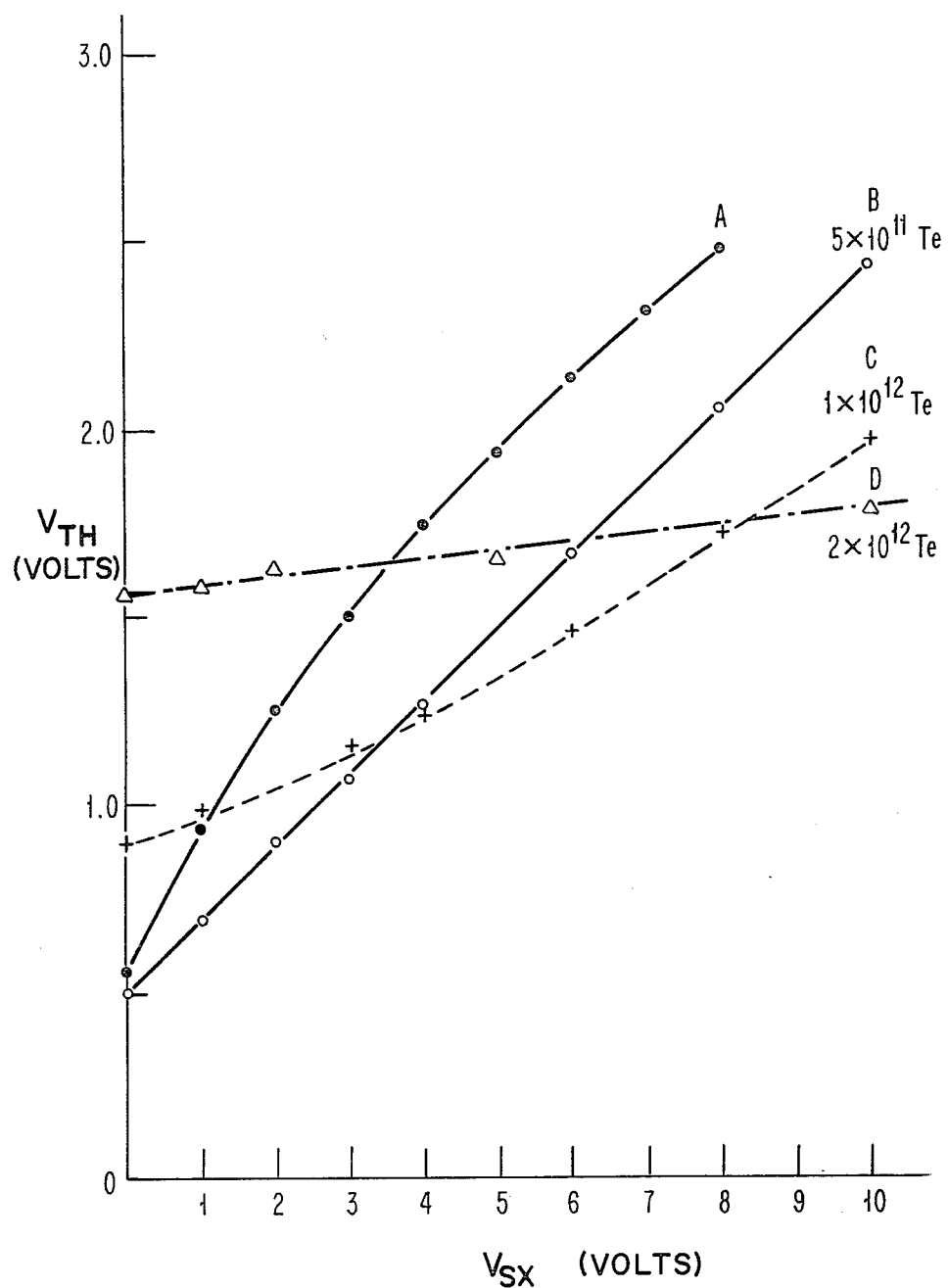
FIG. 4 is an illustration of the substrate sensitivity at room temperature for various implanted concentrations of deeper energy level donor impurities.

Referring next to FIG. 4 a graph is provided that illustrates the improvement obtainable with the invention. A curve labelled A is measured on a control device in a uniformly doped p-conductivity type substrate 1 of FIG. 1 having about 0.5 ohm cm resistivity. The curve A would indicate typical performance of a device without the improvement of the invention. The curves labelled B, C and D are for devices with respective tellurium doses implanted into the region 10 or 11 underneath the gate of the device as set forth in FIG. 1. The curves B, C and D indicate increasingly reduced substrate sensitivity with increasing tellurium concentration. In the case of curve B a concentration of $5 \times 10^{11}$ atoms/cm$^2$ of tellurium was implanted. As may be seen the sensitivity is better than that of curve A. In the case of curve C the concentration is increased to $1 \times 10^{12}$ atoms/cm$^2$ of tellurium. Here the improvement is even greater. In the case of curve D where the quantity of tellurium is $2 \times 10^{12}$ the sensitivity is almost flat over a range of substrate potentials from 0 to $-8$ volts. Curve D shows about 1 order of magnitude improvement over the control device of curve A.

The deep level impurities may be introduced by any of the standard semiconductor processing techniques such as ion implantation, or diffusion. The technique of ion implantation permits concentrations at levels below the surface independent of concentrations in the region between the pre-selected level and the surface. This is particularly advantageous as may be seen from FIG. 1 where the desired concentration location is in the region 11 and that concentration may for various device reasons be desired to be independent from that in the region 10. It is for this reason that ion implantation is preferred.

What has been described is a technique of controlling substrate sensitivity in MOS transistors wherein the substrate sensitivity reduction is provided along with the fabrication of the device and tends not to be sensitive to later processing steps or environmental conditions in final operation of the device.

We claim:

1. A metal oxide semiconductor field effect transistor comprising in combination:
    a substrate of a semiconductor material having a first conductivity type;
    a source region and a drain region separated by a channel region in a first surface of said substrate each said source region and said drain region being of a conductivity type opposite to said first conductivity type of said substrate;
    a gate electrode adjacent to and separated by an oxide layer from said channel region positioned between said source region and said drain region; and
    a substrate sensitivity control region in said substrate aligned with said gate and spaced from said first surface containing low diffusivity deep level impurities of the opposite conductivity type to said first conductivity type in sufficient quantities to provide substantially equivalent opposite charges to compensate for the increase in charges that occur in said channel region as a result of an increase in source region to substrate voltage over the range of operation of said transistor.

2. The transistor of claim 1 wherein said gate electrode is a metal member.

3. A metal oxide semiconductor field effect transistor comprising in combination a source electrode region and a drain electrode region of a first conductivity type separated by a channel region in a surface of a semiconductor substrate of the opposite conductivity type;
    a metal gate electrode between said source and said drain electrode regions adjacent to and separated from said channel region by an oxide layer; and
    a substrate sensitivity control region of a conductivity type opposite to that of said substrate spaced from said surface beneath said channel region said sensitivity control region containing a quantity of low diffusivity deep level impurities operable to provide substantially equivalent opposite polarity charges to compensate for the increase in charges that occur in said channel region over the range of operation of said transistor.

* * * * *